(12) United States Patent
Liu

(10) Patent No.: US 7,292,173 B1
(45) Date of Patent: Nov. 6, 2007

(54) DIGITAL-TO-ANALOG CONVERTER AND METHOD THEREOF

(75) Inventor: Shang-I Liu, Kaohsiung (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 11/309,100

(22) Filed: Jun. 22, 2006

(30) Foreign Application Priority Data

May 3, 2006 (TW) .............................. 95115702 U

(51) Int. Cl.
*H03M 1/66* (2006.01)
(52) U.S. Cl. ...................................... 341/144; 341/172
(58) Field of Classification Search ................ 341/144, 341/143, 155, 172
See application file for complete search history.

(56) References Cited

U.S. PATENT DOCUMENTS 6,326,913 B1\* 12/2001 Chao et al. .................. 341/144
2002/0008650 A1\* 1/2002 Yoon .......................... 341/144

\* cited by examiner

*Primary Examiner*—Jean Bruner Jeanglaude
(74) *Attorney, Agent, or Firm*—Jianq Chyun IP Office

(57) ABSTRACT

A digital-to-analog converter (DA and the method thereof are disclosed. The DAC receives a digital signal with (M+N) bits, and a reference voltage unit sequentially outputs $2^{M+N}$ reference voltages through the $2^N$ output terminals thereof according to at least N timing signals. Afterwards, a control unit outputs at least a reference voltage to a decoding unit according to the above-mentioned N timing signals and the N bits of the digital signal. In the end, the decoding unit selects one of the signals produced by the control unit as the analog signal for output according to the M bits of the digital signal.

14 Claims, 16 Drawing Sheets

US 7,292,173 B1

DIGITAL-TO-ANALOG CONVERTER AND METHOD THEREOF

CROSS-REFERENCE TO RELATED APPLICATION

This application claims the priority benefit of Taiwan application Ser. No. 95115702, filed May 3, 2006. All disclosure of the Taiwan application is incorporated herein by reference.

BACKGROUND OF THE INVENTION

1. Field of Invention

The present invention relates to a digital-to-analog converter (DAC), and more particularly to a DAC which phase by phase outputs the digital signal according to N timing signals.

2. Description of the Related Art

In terms of the mechanism for driving a display panel of a conventional thin film transistor liquid crystal display (TFT LCD), a source driver is used to provide the analog signal required for driving pixels. Wherein, every output terminal of the source drive is electrically connected to a conventional DAC as shown in FIG. 1. Referring to FIG. 1, a conventional DAC (a DAC with 3-bits resolution is taken as exemplary herein) includes three switch units 101~103. The switch units 101~103 are respectively controlled by bits b[3]~b[1], wherein the switches in each switch unit are allocated in couples (for example, SW17 and SW18; SW13 and SW14) and the coupled switches are electrically connected to a same switch. In addition, the coupled switches are controlled by a bit and the phase-inverted bit of the bit, respectively (for example, the switches SW18 and SW17 are respectively controlled by the bit b[1] and the phase-inverted bit thereof /b[1]. Therefore, the reference voltages $V_1$~$V_8$ to be input to the conventional DAC are sequentially delivered through the switching operations of the switch units from 101 to 103 under the controls of the digital signals b[3]~b[1]. In this way, the switch unit 101 selects half of the reference voltages from the reference voltages $V_1$~$V_8$ for outputting and delivering to the switch unit 102. Afterwards, through the switching operation of the switch unit 102, the received four reference voltages (for example, $V_1$, $V_3$, $V_5$ and $V_7$) are selected into two reference voltages for outputting to the switch unit 101. The switch unit 101 would, through switching, select a reference voltage as the output analog signal $V_{out1}$ of the conventional DAC.

According to the above mentioned, a conventional DAC employs multiple switches to implement the switching on the reference voltages. Such a scheme, however, requires a huge number of switches for numerous DACs to be disposed in a source driving circuit, which indicates an excessive cost a TFT LCD needs.

To solve the above-described problem, another conventional DAC 210 was provided. Referring to FIG. 2, the conventional DAC 210 is formed by a conventional DAC 110 and switches SW21 and SW22. The switches SW21 and SW22 are respectively coupled with the output terminal of the conventional DAC 110 to further create two signal output terminals $P_{out21}$ and $P_{out22}$ controlled by timing switching signals $SW_{CLK21}$ and $SW_{CLK22}$. Thus, every two output terminals of a source driver share a same DAC, which is advantageous to downsize the chip area. Wherein, the analog signals are output phase by phase as shown in FIG. 3, which can be achieved by using two non-overlapped timing switching signals $SW_{CLK21}$ and $SW_{CLK22}$. When the timing switching signal $SW_{CLK21}$ turns on the switch SW21, an analog signal $V_{OUT21}$ is produced and delivered to the signal output terminal $P_{OUT21}$; when the timing switching signal $SW_{CLK22}$ turns on the switch SW22, an analog signal $V_{OUT22}$ is produced and delivered to the signal output terminal $P_{OUT22}$.

Although the above-mentioned conventional DAC 210 functions to downsize a chip area, however, it only allows a half of the output terminals of a source driver being able to drive pixels at any time under the 'phase by phase outputting' mode. Under the situation, the available charging time each output terminal can provide to the pixels needs to be shortened, and the available charging time is reduced proportionally with the number of the DACs the output terminals share. In comparison with the conventional DAC 110, on each switching path of the conventional DAC 210, an extra switch is required to be disposed (as shown by the arrows 104 and 201 in FIG. 1 and FIG. 2). Thus, to avoid the increase of the equivalent resistor, the conventional DAC 210 is forced to adopt the switches (SW21 and SW22) with a larger layout area in order to maintain the original performance of the source driver.

SUMMARY OF THE INVENTION

An object of the present invention is to provide a DAC using a control unit controlled by multiple timing signals to reduce the number of the switches inside the circuit and the number of the reference voltage lines, which further lowers the cost of the source driving circuit. Compared with the prior art, the present invention no longer requires increasing the switching paths of the switches; furthermore, the present invention also enables the source driver to drive every output terminal at any time.

Another object of the present invention is to provide a digital-to-analog converting method, where the timings of multiple timing signals are used to make the analog signals output phase by phase and to achieve the advantage of downsizing chip area.

To achieve the above-described and other objectives, the present invention provides a DAC, which includes a reference voltage unit, a control unit and a decoding unit. The reference voltage unit includes $2^M$ output terminals $VR_k$. The control unit coupled with the $2^M$ output terminals of the reference voltage unit delivers at least a reference voltage among the reference voltages output from the above-mentioned output terminals $VR_k$ to the $2^M$ output terminals of the control unit according to the N timing signals and the N bits of the digital signal, respectively. In the end, the decoding unit selects a signal among the signals come from the $2^M$ output terminals of the control unit as an analog signal for output according to M bits of the digital signal. In this way, the converter is able to select a reference voltage from the received $2^{M+N}$ reference voltages $V_q$ (at most) as an analog signal for output according to the digital signal having (M+N) bits, where N, M are integers larger than zero and $1 \leq q \leq 2^{M+N}$, $1 \leq k \leq 2^M$.

According to the DAC of an embodiment of the present invention, each output terminal respectively outputs reference voltages $V_{((k-1) \cdot 2^N)+1}$~$V_{k \cdot 2^N}$ in $2^N$ time phases of an output period, where $V_1 \leq V_2 \leq \ldots \leq V_{2^{(M+N)}}$. According to the DAC of another embodiment of the present invention, each output terminal respectively outputs reference voltages $V_{((k-1) \cdot 2^N)+1}$~$V_{k \cdot 2^N}$ in the $2^N$ time phases of an output period, where $V_1 \geq V_2 \geq \ldots \geq V_{2^{(M+N)}}$.

According to the DAC of an embodiment of the present invention, if the $x^{th}$ bit of the digital signal is represented by b[x], $1 \leq x \leq (M+N)$, b[1] is the least significant bt (LSB) of the digital signal and b[M+N] is the most significant bit (MSB) of the digital signal, the control unit receives b[1]~b[N] of the digital signal, while the decoding unit receives b[N+1]~b[M+N] of the digital signal.

According to the DAC of an embodiment of the present invention, the control unit includes a control circuit and a switching circuit. The control circuit is used for outputting N control signals according to the N timing signals and the bits b[1]~b[N]. The switching circuit electrically connected to the control circuit phase by phase outputs the reference voltages $V_{((k-1)\cdot 2^{-N})+1} \sim V_{k\cdot 2^{-N}}$ provided by the output terminals $VR_k$ according to the control result of the N control signals on the circuit itself.

On the other hand, the present invention provides a digital-to-analog converting method. The method is to provide $2^M$ voltages $VR_k$ in an output period by receiving a digital signal with (M+N)–bits and setting the levels of $2^{M+N}$ reference voltages $V_q$. Wherein, the levels of the voltage $VR_k$ in $2^N$ phases are $V_{((k-1)\cdot 2^{-N})+1} \sim V_{k\cdot 2^{-N}}$, respectively. After that, one of the above-described $2^M$ voltages $VR_k$ is selected, and further at lease a level among the levels $V_{((k-1)\cdot 2^{-N})+1} \sim V_{k\cdot 2^{-N}}$ of the selected voltage $VR_k$ is selected as the analog signal, so as to achieve the objective of digital-to-analog conversion. Wherein, N, M are integers larger than zero, $V_q$ represents the $q^{th}$ reference voltage and $1 \leq q \leq 2^{M+N}$, $a \leq k \leq 2^M$.

The present invention uses N timing signals to respectively control the control unit and the reference voltage unit, so that multiple reference voltages are able to share an output, which contributes to downsize the chip are required by the reference voltage lines and the decoding unit. In comparison with the conventional architecture, the present invention not only achieves the objective of lowering the chip area, but also enables the source driver to driver every output terminal at any time.

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 1:
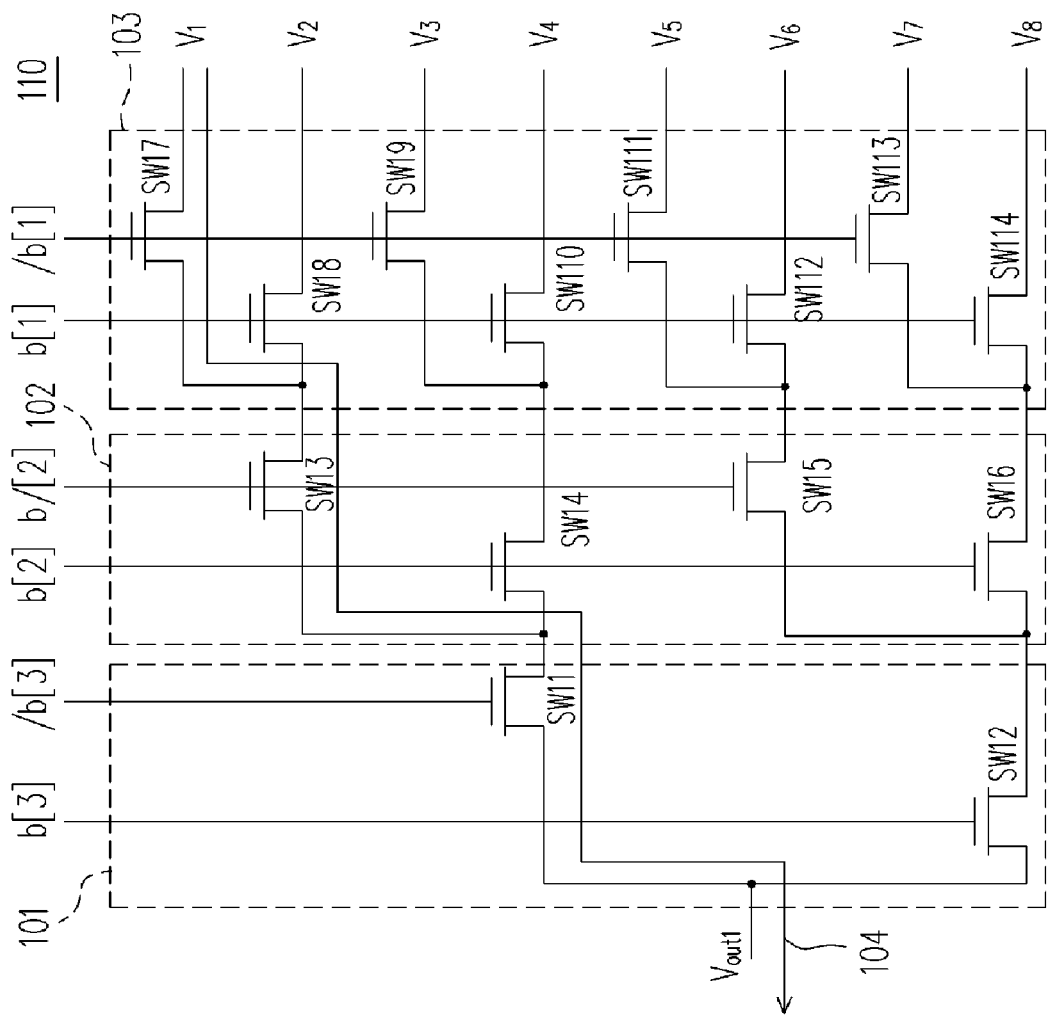
FIG. 1 is a detailed circuit drawing of a conventional digital-to-analog converter (DAC).
Figure 2:
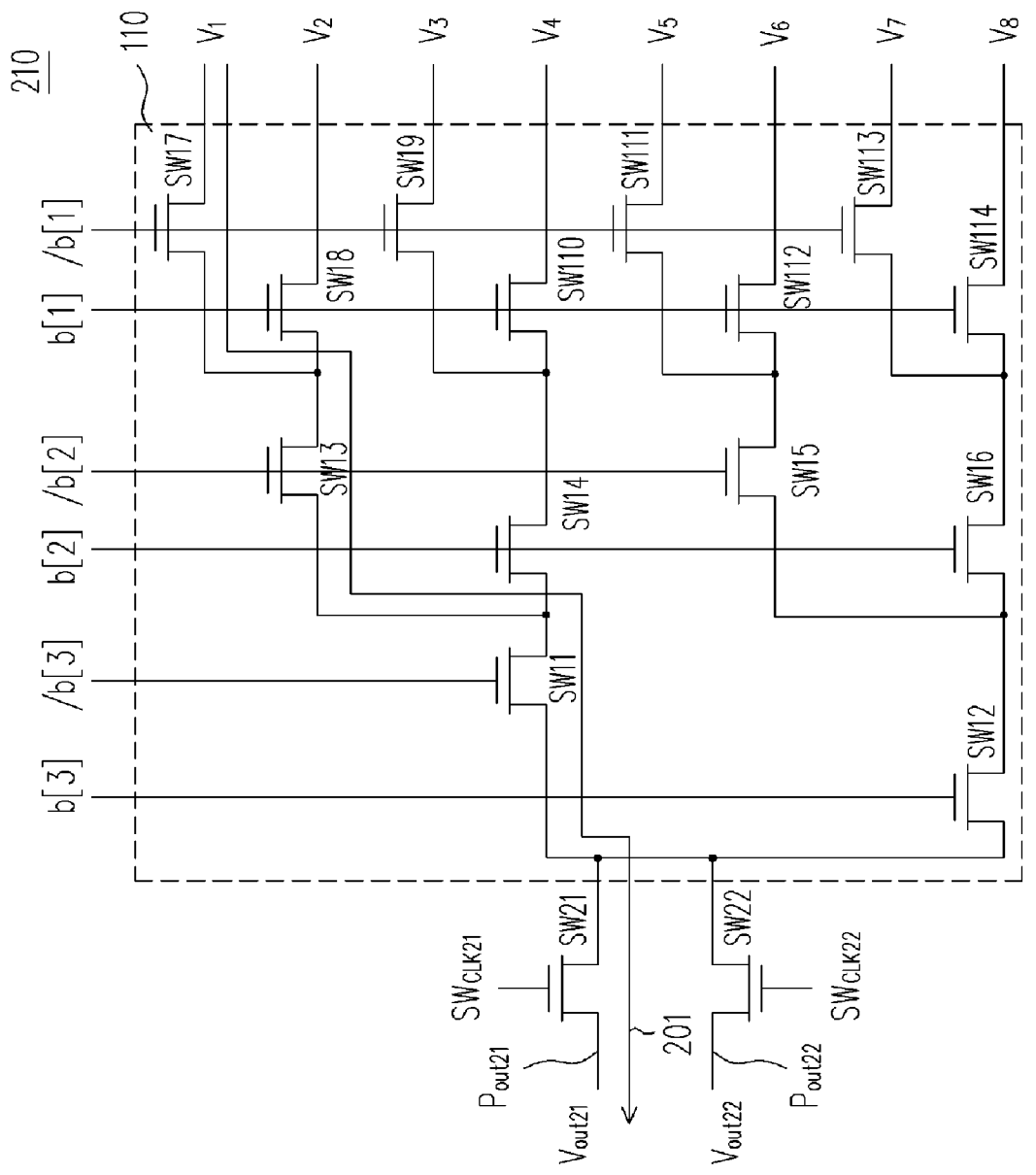
FIG. 2 is a detailed circuit drawing of another conventional DAC.
Figure 3:
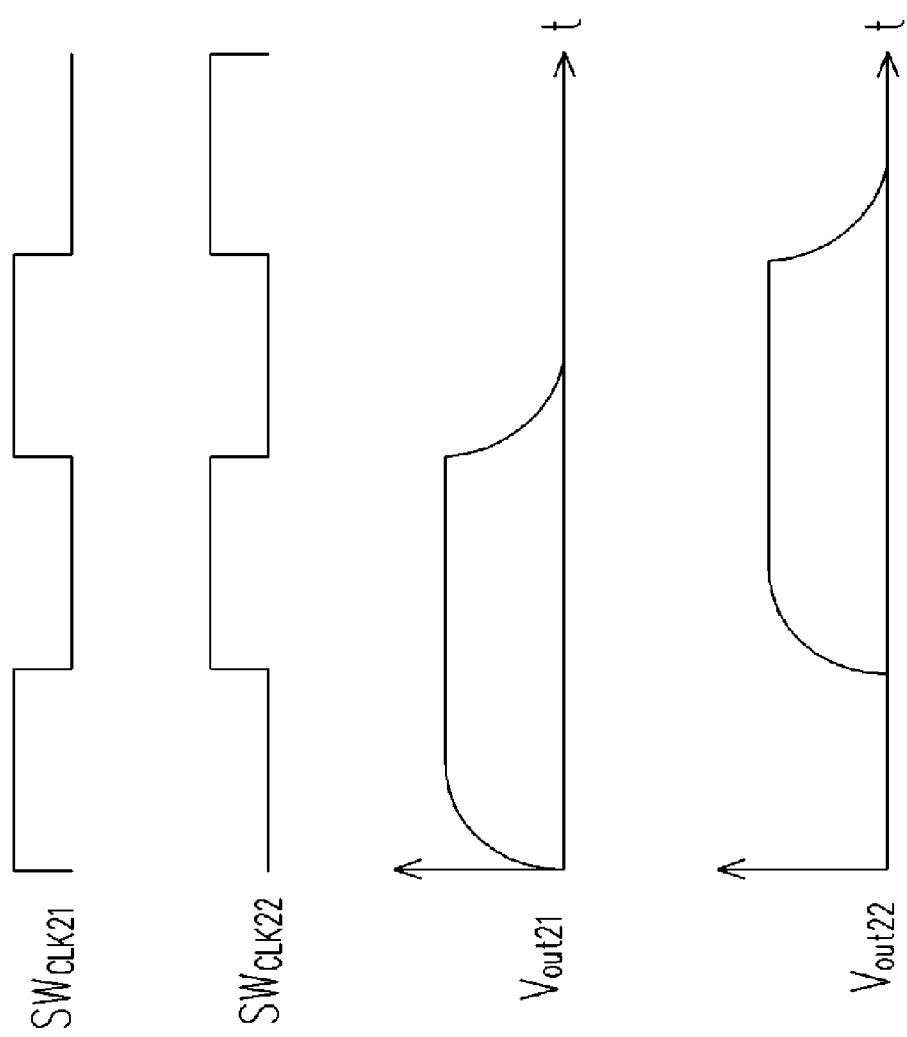
FIG. 3 illustrates the analog signal timing diagrams for the DAC in FIG. 2.
Figure 4:
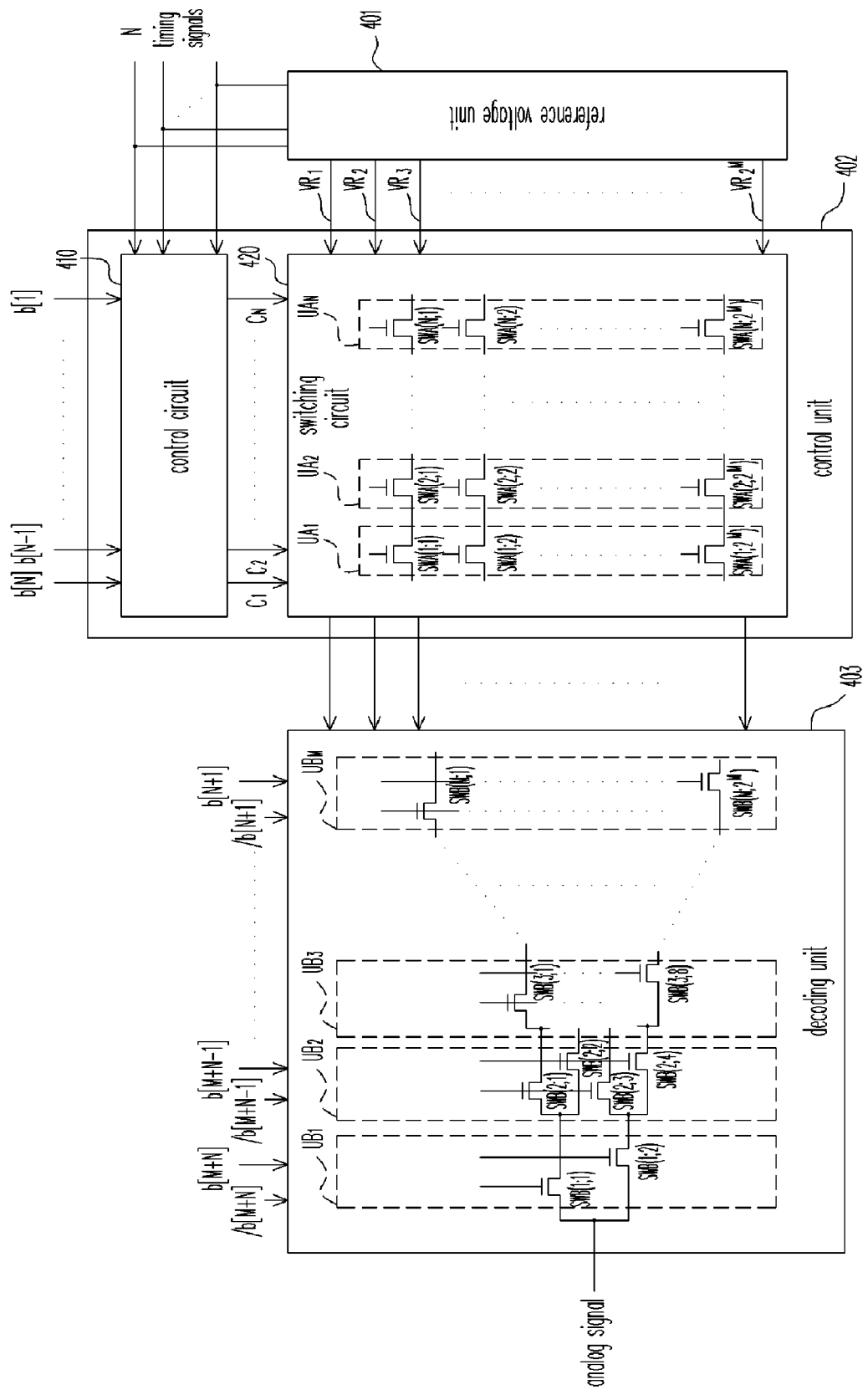
FIG. 4 is a detailed framework drawing of a DAC according to an embodiment of the present invention.

FIG. 4 is a detailed framework drawing of a DAC according to an embodiment of the present invention. Referring to FIG. 4, the DAC receiving a digital signal with (M+N) bits of b[M+N]~b[1] includes a reference voltage unit 401, a control unit 402 and a decoding unit 403, where N and M are integers larger than zero. The reference voltage unit 401 includes $2^M$ output terminals $VR_1 \sim VR_{2^M}$. The control unit 402 is electrically connected to the $2^M$ output terminals of the reference voltage unit 401. The decoding unit 403 is electrically connected to the $2^M$ output terminals of the control unit 402. The reference voltage unit 401 outputs the reference voltages $V_1 \sim V_{2^{(M+N)}}$ through the output terminals $VR_1 \sim VR_{2^M}$ according to the timing of the N timing signals, wherein $VR_k$ represents the $k^{th}$ output terminal and provides the reference voltages $V_{((k-1)\cdot 2^{-N})+1} \sim V_{k\cdot 2^{-N}}$, where $1 \leq k \leq 2^M$. Afterwards, the control unit 402 delivers one of the reference voltages $V_{((k-1)\cdot 2^{-N}+1} \sim V_{k\cdot 2^{-N}}$ output from each of the above-mentioned output terminals $VR_k$ to the $2^M$ output terminals of the control unit 402 according to the above-mentioned N timing signals and the N bits b[N]~b[1] of the digital signal. In the end, the decoding unit 403 selects one of the output signals come from the $2^M$ output terminals of the control unit 402 as an analog signal for output according to the M bits b[M+N]~b[N+1] and the bits /b[M+N]~/b[N+1]. Wherein, the bits /b[M+N]~/b[N+1] are logic-levels to the bits b[M+N]~b[N+1], respectively.

Among the above-mentioned reference voltages, the reference voltage $V_1$ has the lowest level, the reference voltage $V_2$ has a level next to the lowest, and the rest can be analogized. The reference voltage $V_{2^{-}(M+N)}$ has the highest level, i.e., $V_1 \leq V_2 \leq \ldots \leq V_{2^{-}(M+N)}$. The bit b[1] is the least significant bit (LSB) of the digital signal, while bit b[M+N] is the most significant bit (MSB) of the digital signal. In addition, anyone skilled in the art is able to re-design the levels of the reference voltages $V_1 \sim V_{2^{-}(M+N)}$ into $V_1 \geq V_2 \geq \ldots \geq V_{2^{-}(M+N)}$ to fit the different application requirements.

The control unit 402 of the embodiment in FIG. 4 includes a control circuit 410 and a switching circuit 420. The switching circuit 420 includes N switching units $UA_1 \sim UA_N$ and each of the switching units $UA_1 \sim UA_N$ includes $2^M$ switches. The second terminal of the switch SWA(1;1) is coupled with the first terminal of the switch SWA(2;1); the second terminal of the switch SWA(1;2) is coupled with the first terminal of the switch SWA(2;2); and the second terminal of the switch SWA(N;1) is coupled with the output terminal $VR_0$ of the reference voltage unit 401. Analogically, the second terminal of the switch SWA(s;k) is coupled with the first terminal of the switch SWA(s+1;k), while the second terminal of the switch SWA(N;k) is coupled with the output terminal $VR_k$ of the reference voltage unit 401, where SWA(s;k) indicates the $k^{th}$ switch of the $s^{th}$ switching unit UAs, $1 \leq s \leq N$.

Continuing to FIG. 4, in terms of the overall operation of the control unit 402, first, the control circuit 410 outputs N control signals $C_1$~$C_N$ to the switching circuit 420 according to the N timing signals and the N bits b[1]~b[N]. Next, each switch in the switching circuit 420 decides on/off status thereof according to the control signals $C_1$~$C_N$, respectively, so that one of the reference voltages $V_1$~$V_{2^{(M+N)}}$ is allowed to be output to the decoding unit 403. Wherein, the control terminals of the switches SWA(1;1)~SWA(1;$2^M$) receive the control signal $C_1$, while the control terminals of the switches SWA(2;1)~SWA(2;$2^M$) receive the control signal $C_2$. Analogically, the control terminal of the switch SWA(t;r) receives the control signal $C_t$, $1 \leq t \leq N$.

The decoding unit 403 of the embodiment in FIG. 4 includes M switch units $UB_1$~$UB_M$. The switch unit $UB_1$ includes two switches SWB(1;) and SWB(1;2). The switch unit $UB_2$ includes four ($2^2$) switches SWB(2;1)~SWB(2;4). Analogically, the $i^{th}$ switch unit $UB_i$ includes $2^i$ switches SWB(i;k), wherein SWB(i;k) represents the $k^{th}$ switch of the $i^{th}$ switch unit $Ub_i$, and $1<i<M$.

The second terminal of the switch SWB(1;1) is electrically connected to the first terminals of the switches SWB(2;1) and SWB(2;2); the second terminal of the switch SWB(1;2) is electrically connected to the first terminals of the switches SWB(2;3) and SWB(2;4); the control terminal of the switch SWB(1;1) receives the bit b[M+N], while the control terminal of the switch SWB(1;2) receives the bit /b[M+N]. Analogically, the second terminal of the switch SWB(j;k) is electrically connected to the first terminals of the switches SWB(j+1;2k−1) and SWB(j+1;2k) and the second terminal of the switch SWB(M;k) is coupled with the switching unit 420. The control terminal of the switch SWB(i;2g−1) receives the bit b[M+N+1−i], while the control terminal of the switch SWB(i;2g) receives the bit /b[M+N+1−i]. Wherein, the logic-level of the bit /b[i] is inverted to bit b[i], $1 \leq j \leq (M-1)$ and the g values range is: $1 \leq g \leq 2^{i \leq 1}$.

The decoding unit 403 has the similar working principle and the architecture to the conventional DAC. By using the scheme that the switches in every switch unit of $UB_1$~$UB_M$ are allocated in couples (for example, SWB(2;1) and SWB(2;2) form a couple), the switches of a couple are electrically connected to a same switch (for example, SWB(1;1)) and the switches in a couple are respectively controlled by a bit and the phase-inverted bit of the bit (for example, SWB(2;1) and SWB(2;2) are respectively controlled by the bit b[M+N−1] and the phase-inverted bit /b[M+N+1]), one of the signals provided by the output terminals $2^M$ of the control unit 402 would be selected by the decoding unit 403 after the sequentially switching operation of the switch units $UB_1$~$UB_M$ as an analog signal for output.

Figure 5:
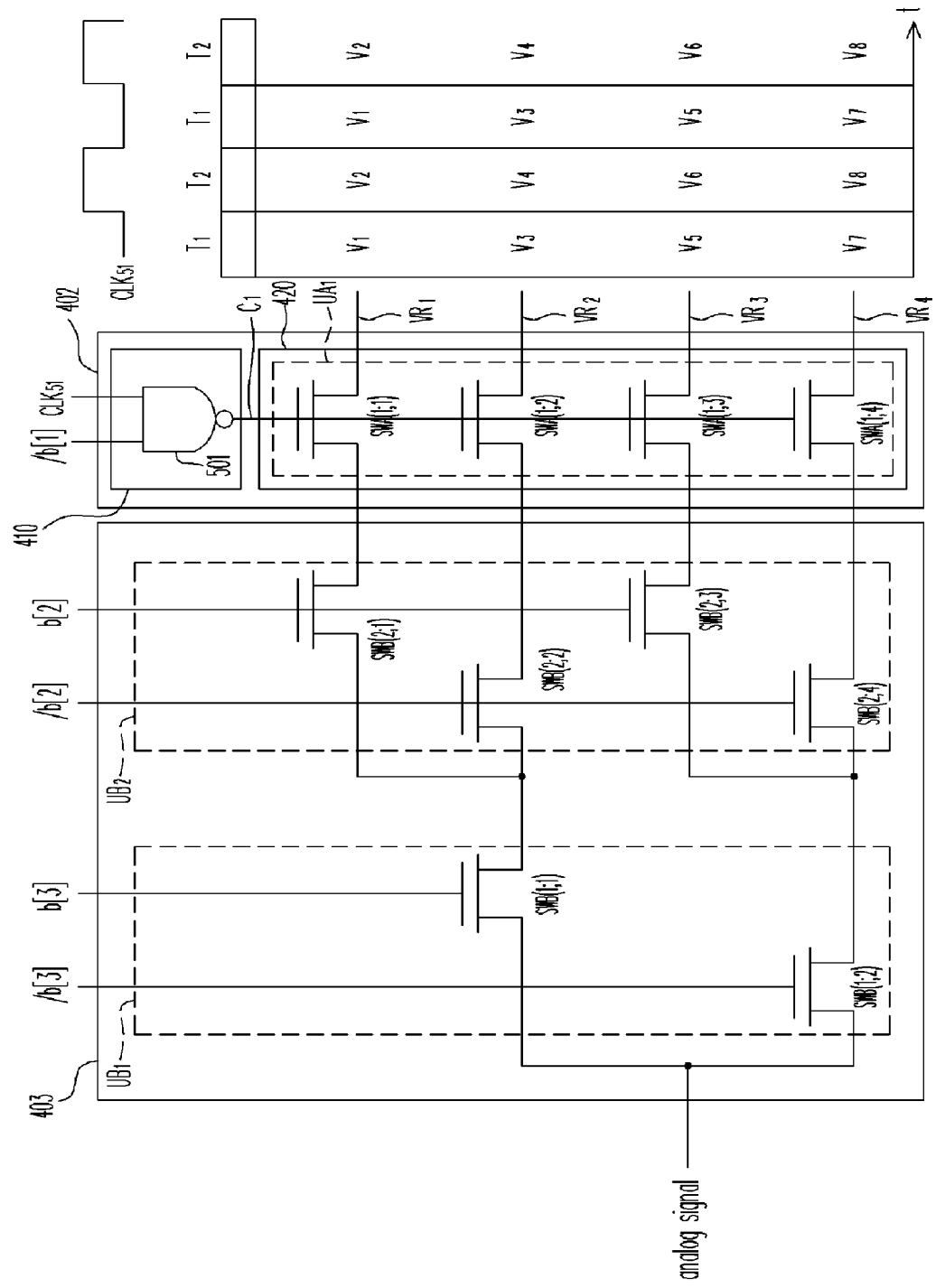
FIG. 5 is a detailed circuit drawing of a 3-bit DAC according to an embodiment of the present invention.

To better explain the present invention, an embodiment of 3-bits DAC is taken as exemplary. As shown in FIG. 5, it is an embodiment corresponding to N=1 and M=2 in FIG. 4, that is, the control unit 402 receives one bit b[1] of the digital signal, while the decoding unit 403 receives two bits b[2] and b[3] of the digital signal. The control circuit 410 of the control unit 402 is formed by an NAND-gate 501. The switching circuit 420 includes a switching unit $UA_1$ formed by $2^2$ switches SWA(1;1)~SWA(1;4). The decoding unit 403 includes switch units $UB_1$ and $UB_2$. The switch unit $UB_1$ includes switches SWB(1;1) and SWB(1;2), while the switch unit $UB_2$ includes switches SWB(2;1)~SWB(2;4), The first terminal of the NAND-gate 501 is used for receiving the inverted signal /b[1] of the bit b[1], while the second terminal thereof receives a timing signal $CLK_{51}$ and outputs a control signal $C_1$ according to the received signal. The wiring relationships of the switches SWA(1;1)~SWA(1;4), the switches SWB(1;1) and SWB(1;2), and the switches SWB(2;1)~SWB(2;4) can be obtained by a relationship derived from the embodiment in FIG. 4, and the detail is omitted to describe herein.

Figure 6A:
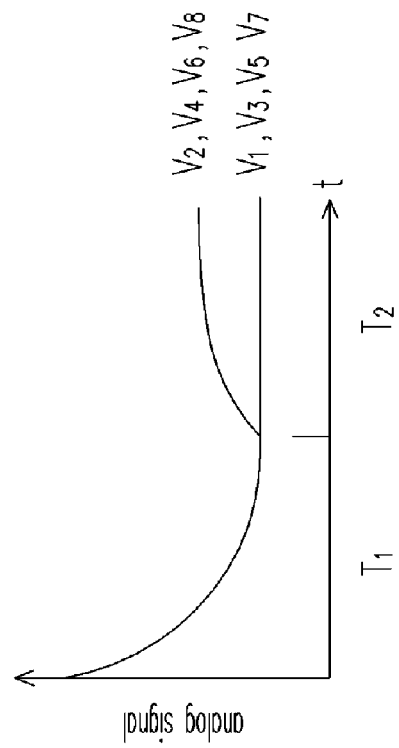
FIGS. 6A and 6B are analog signal timing diagrams for the DAC in FIG. 5.
Figure 6B:
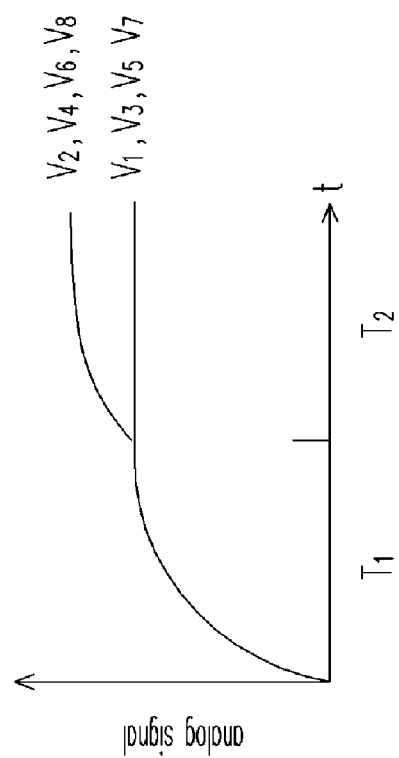

Prior to describing the working principle of the embodiment of FIG. 5, the mode 'output phase by phase' is to be defined first. The so-called 'output phas by phase' mode means that the DAC outputs the analog signal by $2^N$ phases according to the number N of the bits received by the control unit 402. Thus, the output timing of the analog signal corresponding to the case N=1 of the FIG. 5 embodiment is as shown in FIGS. 6A and 6B, where the analog signal is output by two phases ($T_1$ and $T_2$). If the analog signal is one of $V_1$, $V_3$, $V_5$ and $V_7$ (for example, $V_1$), the analog signal would be charged/discharged to a predetermined level (for example, $V_1$) in the first phase and hold the level (for example, $V_1$) in the second phase. On the other hand, if the analog signal is one of $V_2$, $V_4$, $V_6$ and $V_8$ (for example, $V_2$), the analog signal would be charged/discharged to one of $V_1$, $V_3$, $V_5$ and $V_7$ (for example, $V_1$) in the first phase and be re-charged to a predetermined level (for example, $V_2$) in the second phase.

Continuing to FIG. 5, FIG. 6A and FIG. 6B, the working principle of the present embodiment is explained as follows. The reference voltage unit 401 represented by a block in FIG. 5 is omitted for simplicity. Instead, the reference voltage unit 401 respectively outputs the reference voltages $V_1$~$V_8$ through the output terminals $VR_1$~$VR_4$ according to a timing signal $CLK_{51}$. As shown in FIG. 5, the reference voltage unit 401 sends out the reference voltages $V_1$, $V_3$, $V_5$ and $V_7$ in the first phase $T_1$ and sends out the reference voltages $V_2$, $V_4$, $V_6$ and $V_8$ in the second phase $T_2$ according to the timing signal $CLK_{51}$. The reference voltages $V_1$~$V_8$ are allocated in couples and the two voltages of a couple are provided by an output terminal of $VR_1$~$VR_4$ (for example, $V_1$ and $V_2$ are provided by the output terminal $VR_1$). Next, the control circuit 410 in the first phase $T_1$ output a control signal $C_1$ with a high-level (logic-1) in response to the low-level (logic-0) of the timing signal $CLK_{51}$ which makes the NAND-gate 501 ignore the phase-inverted signal /b[1] of the bit b[1]. The switches SWA(1;1)~SWA(1;4) in the switching unit 420 hold on-state in the first phase $T_1$ according to the control signal $C_1$, so as to output the reference voltages $V_1$, $V_3$, $V_5$ and $V_7$ to the four output terminals of the control unit 402, respectively. At the point, as shown in FIGS. 6A and 6B, the decoding unit 403 would select one of signals provided by the four output terminals of the control unit 402 according to the bits b[2], b[8], /b[2], and /b[3], so that the analog signal is charged/discharged to one of the reference voltages $V_1$, $V_3$, $V_5$ and $V_7$ (for example, $V_1$) in the first phase $T_1$.

Afterwards, in the second phase $T_2$, the control circuit 410 makes the control signal $C_1$ output from the NAND-gate 501 the same as the bit b[1] in response to the high-level (logic-1) of the timing signal $CLK_{51}$. Thus, if the bit b[1] is the high-level (logic-1), i.e. the predetermined output level of the analog signal is one of $V_2$, $V_4$, $V_6$ and $V_8$ (for example, $V_2$), the control signal $C_1$ would turn on the switches SWA(1;1)~SWA(1;4) in the switching unit 420, so that the reference voltages $V_2$, $V_4$, $V_6$ and $V_8$ are respectively output to the four output terminals of the control unit 402. In this way, as shown in FIGS. 6A and 6B, the decoding unit 403 is able to make the analog signal charge to a predetermined output level (for example, $V_2$) in the second phase $T_2$ according to the bits b[2], b[3], /b[2] and /b[3]. On the other hand, if the bit b[1] is the low-level (logic-0), i.e. the predetermined output level of the analog signal is one of $V_1$, $V_3$, $V_5$ and $V_7$ (for example, $V_1$), the switches SWA(1;)

~SWA(1;4) in the switching unit 420 would be off under the control of the control signal $C_1$, which further makes the output terminal of the decoding unit 403 in floating-state and the analog signal in the second phase $T_2$, and accordingly hold the level obtained in the first phase $T_1$ (for example, $V_1$).

Figure 7:
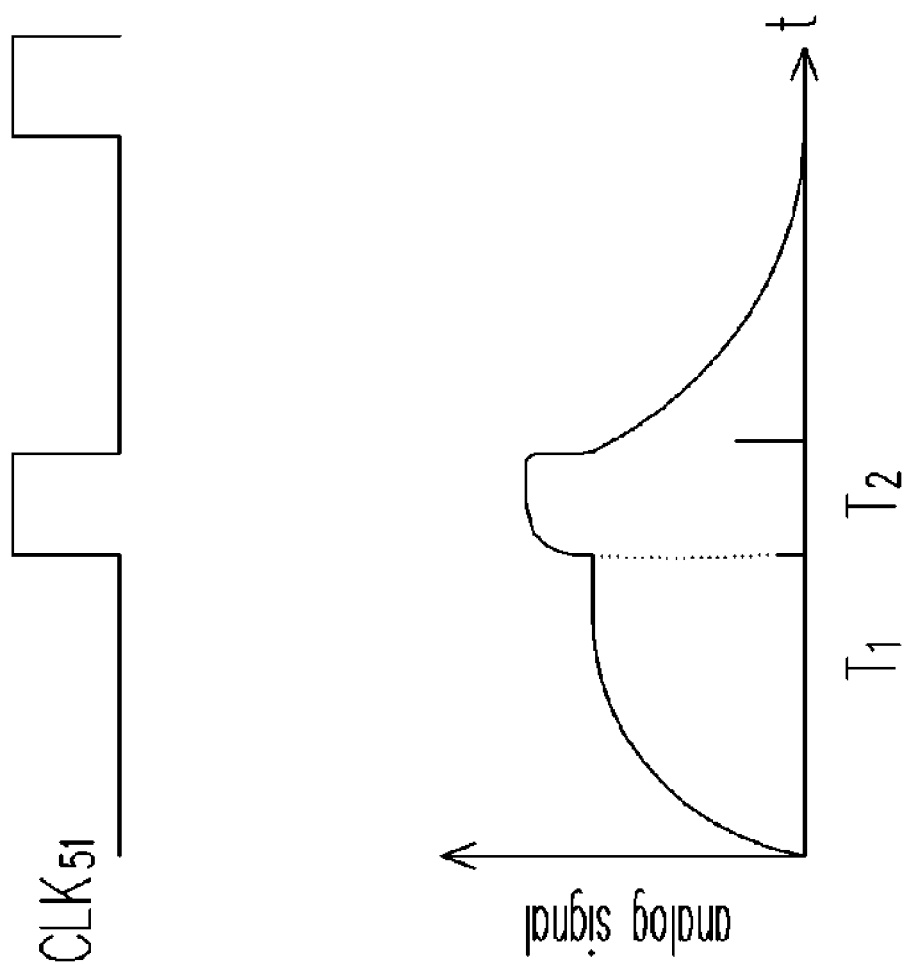
FIG. 7 is another analog signal timing diagram for the DAC in FIG. 5.

According to the above-described embodiment, by rearranging the duty cycle of the timing signal $CLK_{51}$, the analog signal can be charged/discharged phase by phase for more effectively utilizing time. The scheme is shown by FIG. 7 where the charge time of the analog signal in the second phase $T_2$ is far less than the charge time in the first phase $T_1$ due to a minor difference between tow consecutive reference voltages (for example, difference between $V_1$ and $V_2$). If the DAC receives a 3-bits digital signal, sequentially 000-111-000, the output analog signal during the phase-by-phase charging period has a timing distribution as shown in FIG. 7 where a reduced time ratio corresponding to the second phase $T_2$ suggests a more effectively utilization of the timing signal $CLK_{51}$.

Figure 8:
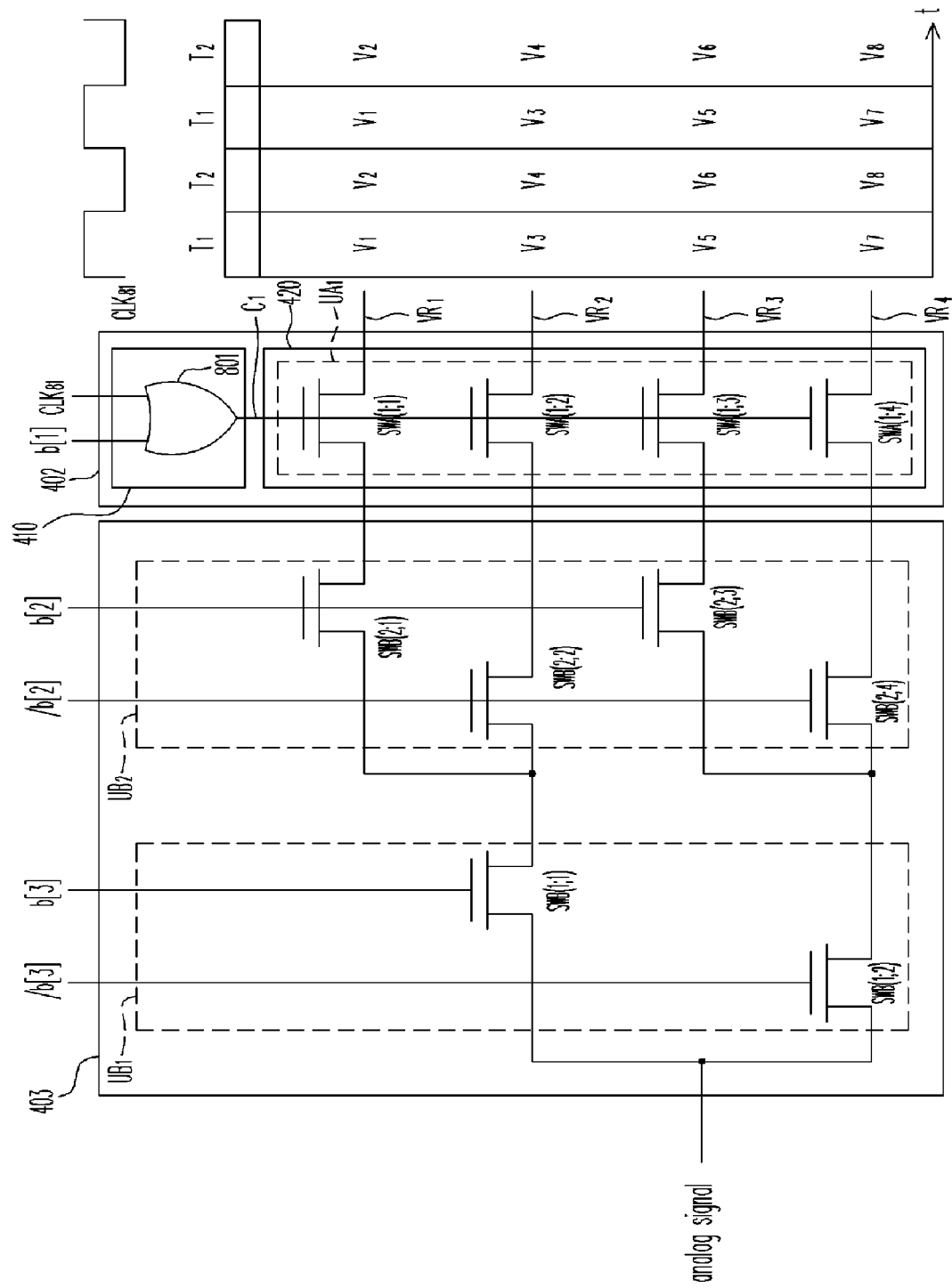
FIG. 8 is a detailed circuit drawing of another 3-bit DAC according to an embodiment of the present invention.

In addition, the control circuit 410 in the embodiment of FIG. 5 can adopt another design as well. Referring to FIG. 8, the control circuit 410 in FIG. 5 is formed by an OR-gate 801. For convenience of explanation, a detailed architecture of a DAC similar to FIG. 5 is illustrated by FIG. 8. Wherein, the first terminal and the second terminal of the OR-gate 801 respectively receive the bit b[1] and the timing signal $CLK_{51}$, and the OR-gate 801 outputs a control signal $C_1$ to the control terminals of the switches SWA(1;1)~SWA(1;4). The coupling relationships of the switching circuit 420, the decoding unit 403 and the output timing and the routed output terminals of the reference voltages $V_1$~$V_8$ are the same as FIG. 5, so the details are omitted to describe herein.

Continuing to FIG. 8, in spite of the modification of the control circuit 410, as long as the control circuit 410, as FIG. 5, is able to output a control signal $C_1$ with a high-level (logic-1) to the switching unit 420 in the first phase $T_1$ and the control signal $C_1$ output from the control circuit 410 is equal to the bit b[1] in the second phase $T_2$, the working principle described by the embodiment in FIG. 4 is still valid. Thus, the present embodiment utilizes a timing signal $CLK_{81}$ holding a high-level (logic-1) in the first phase $T_1$ to enable the control circuit 410 to output a control signal $C_1$ with a high-level (logic-1) to the switching unit 420 and makes the timing signal $CLK_{81}$ hold a low-level (logic-0), so that the control signal output from the OR-gate 801 can be equal to the bit b[1]. As a result, that the analog signal is able to be output phase by phase as shown in FIGS. 6A and 6B.

Figure 9:
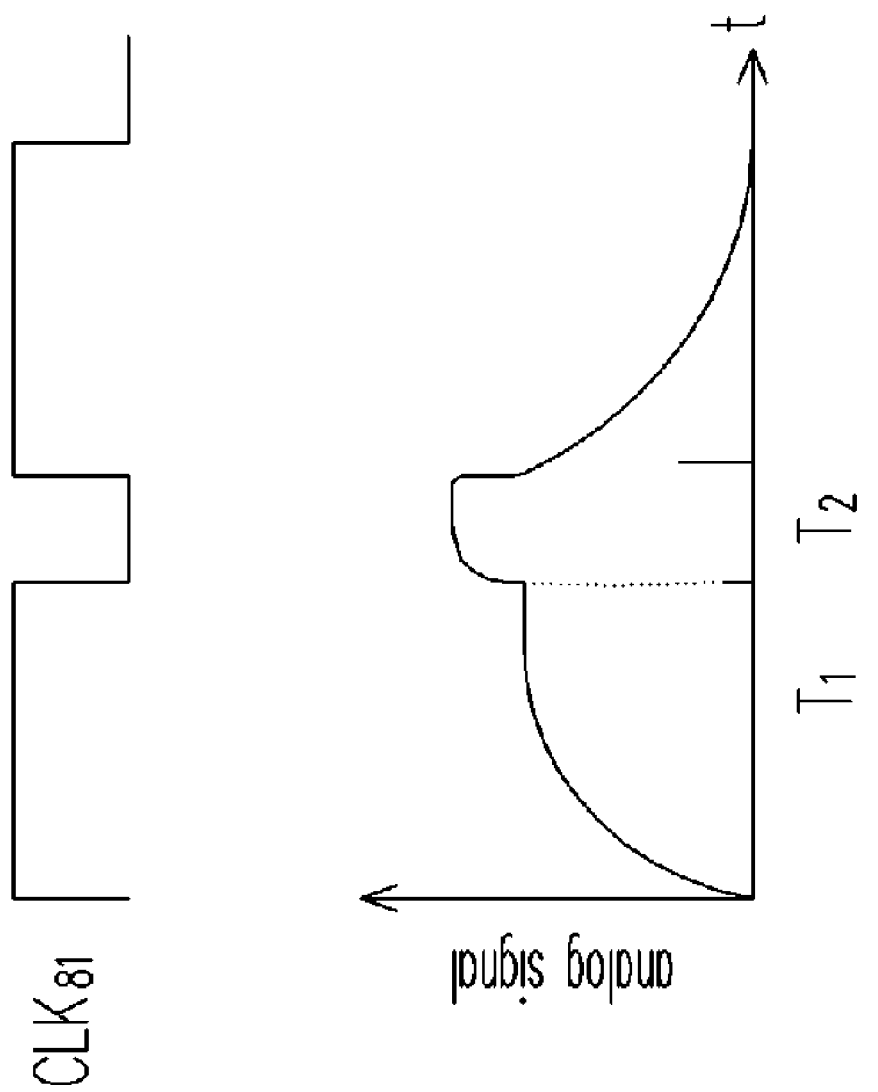
FIG. 9 is an analog signal timing diagram for the DAC in FIG. 8.

According to the embodiment of FIG. 8, the analog signal can be charged/discharged phase by phase for more effectively utilizing time, as the embodiment in FIG. 5. Referring to FIG. 9, if the DAC receives a 3-bits digital signal, sequentially 000-111-000, the time ratio corresponding to the second phase $T_2$ is reduced as in FIG. 7, a more effectively utilization of the duty cycle of the timing signal $CLK_{51}$ is expected.

Figure 10:
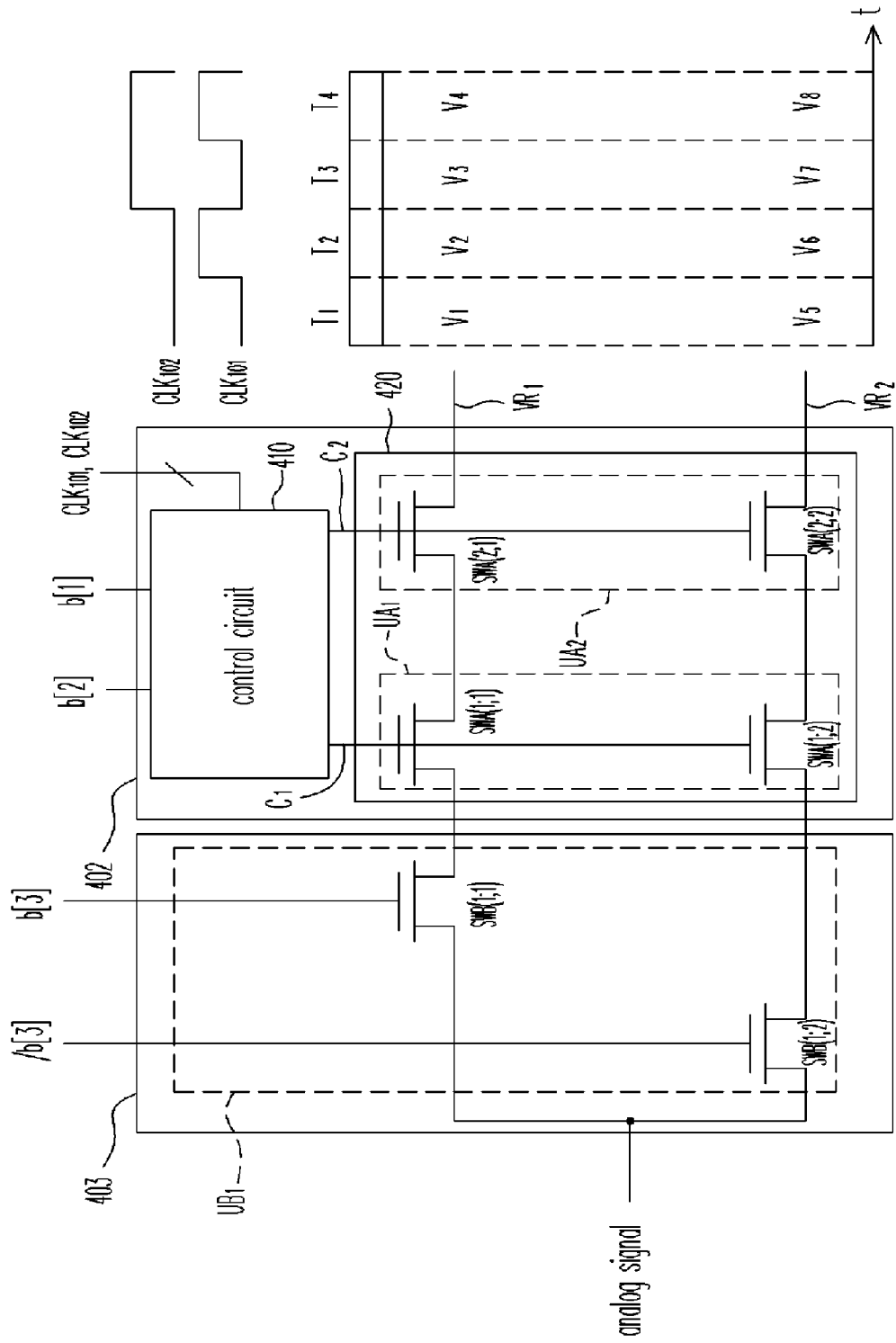
FIG. 10 is a detailed circuit drawing of another 3-bit DAC according to an embodiment of the present invention.

Another embodiment of a 3-bit DAC is given hereinafter. Referring to FIG. 10, the present embodiment corresponds to the case of N=2 and M=1 in FIG. 4, which means the control unit 402 receives the two bits of b[2] and b[1] in the digital signal and the decoding unit 403 receives a bit b[3] and a bit /b[3] in the digital signal. The switching circuit 420 includes two switching units $UA_1$ and $UA_2$, while the switching units $UA_1$ and $UA_2$ respectively include switches SWA(1;1) and SWA(1;2) and switches SWA(2;1) and SWA (2;2). The decoding unit 403 is formed by a switch unit $UB_1$, while the switch unit $UB_1$ includes switches SWB(1;1) and SWB(1;2). The coupling relationships of the switches SWA (1;1), SWA(1;2), SWA(2;1) and SWA(2;2) in the control circuit 410 and the switching circuit 420 and the switches SWB(1;1) and SWB(1;2) in the decoding unit 403 follow the relationship derived in FIG. 4, so the detail is omitted to describe herein.

Figure 11A:
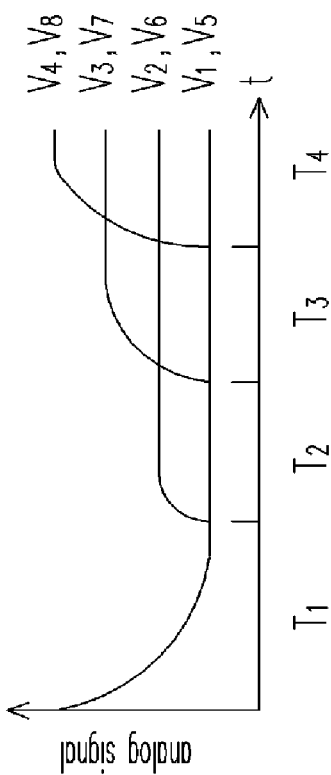
FIGS. 11A and 11B are analog signal timing diagrams for the DAC in FIG. 10.
Figure 11B:
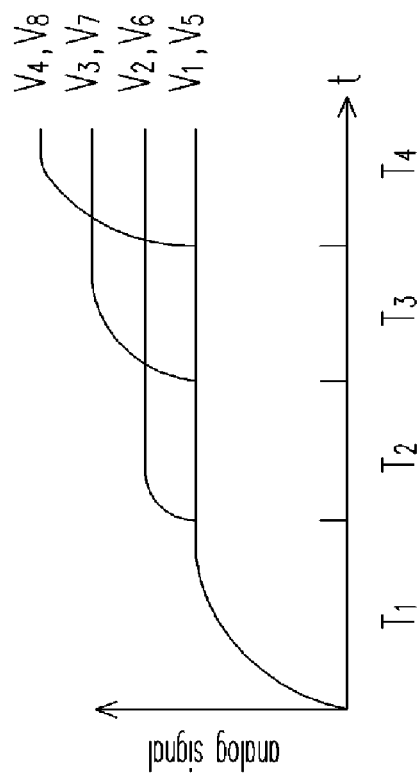
Figure 12A:
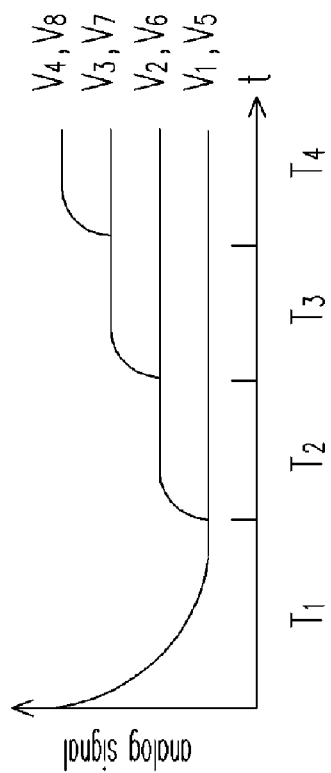
FIGS. 12A and 12B are another set of the analog signal timing diagrams for the DAC in FIG. 10.
Figure 12B:
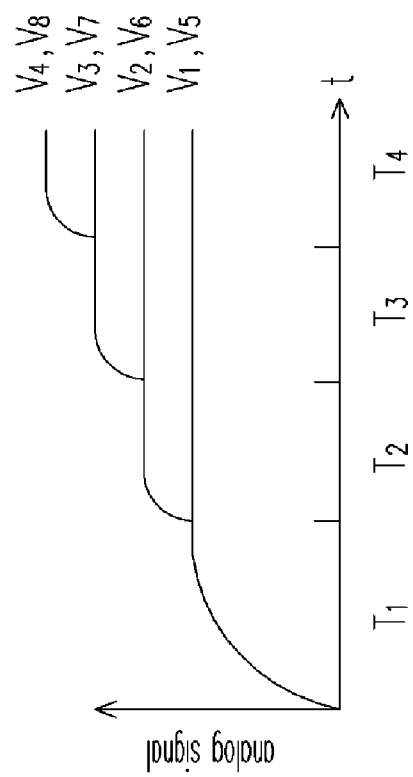

The embodiment of FIG. 10 makes an analog signal output by $2^2$ phases according to N=2, the number of the bits received by the control unit 402. In an output timing formed by four phases $T_1$~$T_4$, associated with a modified design of the control circuit 410, the analog signal has various output distributions with multi-phases. One of the timings in 'output phase by phase' mode is shown by FIGS. 11A and 11B, wherein if the predetermined output level of the analog signal is the reference voltage $V_3$ during the output course formed by four phases $T_1$~$T_4$, the analog signal can be charged to the reference voltage $V_1$ in the first phase $T_1$. In the second phase $T_2$, the analog signal holds the reference voltage $V_1$. Afterwards, in the third phase $T_3$, the analog signal is recharged to the reference voltage $V_3$, and in the fourth phase $T_4$ the analog signal holds the predetermined level, the reference voltage $V_3$. In addition, according to FIGS. 11A and 11B, the output course of the analog signal with a final level of the reference voltage $V_3$ can be in this way. The analog signal is charged to the reference voltage $V_1$ in the first phase $T_1$. In the second phase $T_2$, the analog signal is recharged to the reference voltage $V_2$. Afterwards, in the third phase $T_3$, the analog signal is recharged to the reference voltage $V_3$, and in the fourth phase $T_4$ the analog signal holds the predetermined level, the reference voltage $V_3$. Another variation of the phase-by-phase output timing is shown by FIGS. 12A and 12B, where after the analog signal is charged to the predetermined level, the analog signal in thereafter phase holds the level of the previous phase. For example, the predetermined level of an analog signal is the reference voltage $V_3$, the analog signal is charged repeatedly phase by phase, from the first phase to the third phase, to the final level of the reference voltage $V_3$, followed by holding the analog signal in the reference voltage $V_3$ in the fourth phase. Therefore, in comparison with FIGS. 11A and 11B, the 'output phase by phase' mode shown by FIGS. 12A and 12B can be covered by the scheme of FIGS. 11A and 11B.

Figure 13:
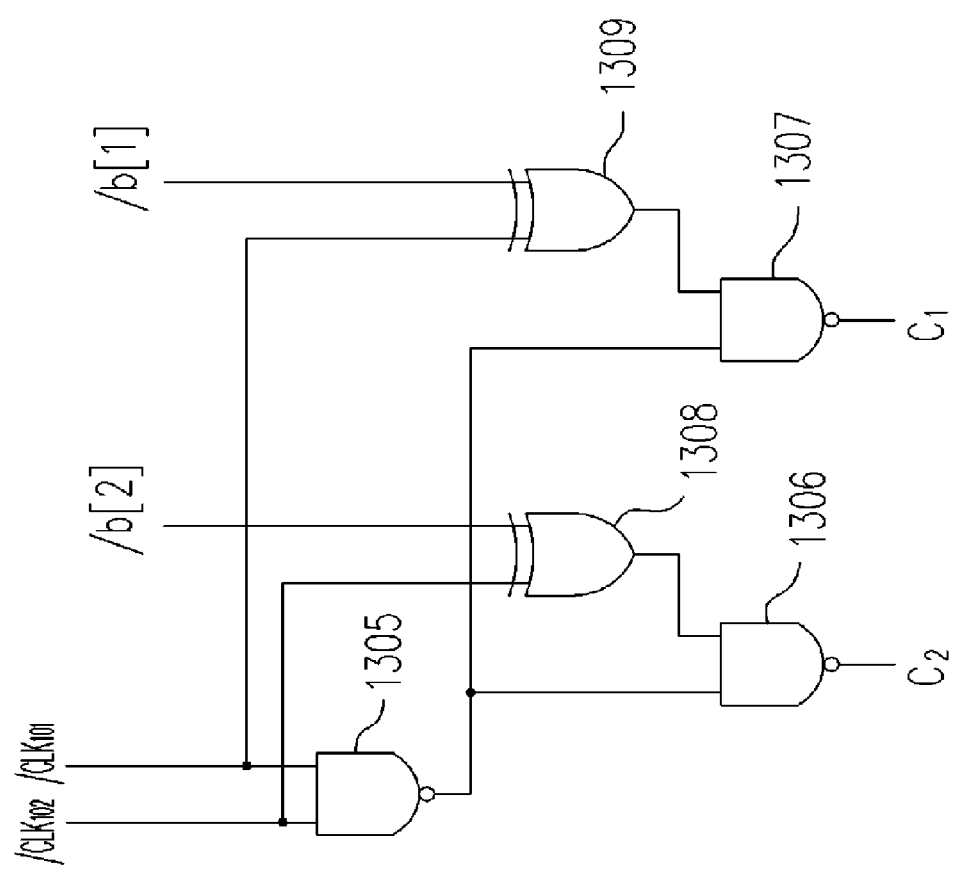
FIG. 13 is a detailed drawing of a control circuit according to an embodiment of the present invention.

According to the 'output phase by phase' mode shown by FIGS. 11A and 11B, a control circuit 410 compliant with the embodiment of FIG. 10 is given by FIG. 13. The control circuit 410 includes NAND-gates 1305~1307 and XOR-gates 1308 and 1309. The first terminal of the NAND-gate 1305 receives the phase-inverted signal /$CLK_{101}$ of the timing signal $CLK_{101}$, while the second terminal thereof receives the phase-inverted signal /$CLK_{102}$ of the timing signal $CLK_{102}$. The first terminal of the XOR-gate 1308 receives the phase-inverted signal /$CLK_{102}$ of the timing signal $CLK_{102}$, while the second terminal thereof receives the phase-inverted signal /b[1] of the bit b[1]. The first terminal and the second terminal of the NAND-gate 1306 are electrically connected to the output terminals of the NAND-gate 1305 and the XOR-gate 1308, respectively. In addition, the first terminal and the second terminal of the NAND-gate 1307 are electrically connected to the output terminals of the NAND-gate 1305 and the XOR-gate 1309, respectively.

The reference voltages $V_1$~$V_8$ output from the reference voltage unit 401 are divided into two sets of four reference voltages according to the architecture of the system and each set of the four references voltages is provided by an output terminal (for example, $V_1$~$V_4$ are provided by the output terminal $VR_0$). According to the timing signals $CLK_{101}$ and $CLK_{102}$, the reference voltages $V_1$ and $V_5$ among the reference voltages $V_1 \sim V_8$ are sent out in the first phase $T_1$; the reference voltages $V_2$ and $V_6$ are sent out in the first phase $T_2$, and the rest can be analogized as shown in FIG. 10. Afterwards, in the control unit 402 for receiving the reference voltages $V_1 \sim V_8$, the NAND-gate 1305 outputs a low-level (logic-0) in the first phase where the timing signals $CLK_{101}$ and $CLK_{102}$ take a low-level (logic-0). Thus, the NAND-gates 1306 and 1307 output the control signals $C_1$ and $C_2$ with high-level (logic-1) to turn on the switches SWA(1;1), SWA(1;2), SWA(2;1) and SWA(2;2) in the control unit 420, so as to respectively deliver the reference voltages $V_1$ and $V_5$ to the two output terminals of the control unit 402. The decoding unit 403 charges the analog signal to one of the levels of the reference voltages $V_1$ and $V_5$ according to the bits b[3] and /b[3].

In the following second phase $T_2$, the timing signals $CLK_{101}$ and $CLK_{102}$ respectively take a high-level (logic-1) and a low-level (logic-0) and the NAND-gate 1305 outputs a high-level (logic-1), which makes the control signals $C_2$ and $C_1$ output from the NAND-gates 1306 and 1307 inverted to the outputs of the XOR-gates 1308 and 1309, respectively. Since the XOR-gates 1308 and 1309 respectively output the bits b[2] and /b[1] at the point, the control signals $C_2$ and $C_1$ are /b[2] and b[1] opposite to the b[2] and /b[1]. Analogically, the control signals $C_2$ and $C_1$ in the third phase $T_3$ should be b[2] and /b[1], respectively, while the control signals $C_2$ and $C_1$ in the fourth phase $T_4$ should be b[2] and b[1], respectively. In this way, the switching circuit 420 is able to achieve the 'output phase by phase' mode as shown in FIGS. 11A and 11B in the phases $T_2 \sim T_4$ by using the bits b[2] and b[1] to control the switching circuit 420. For example, if the predetermined level of the analog signal is the reference voltage $V_3$, that is, the bits b[2] and b[1] are a high-level (logic-1) and a low-level (logic-0) respectively, the switching circuit 420 in the second phase $T_2$ produces the control signals $C_2$ and $C_1$ both with a low-level (logic-0), which turns off the switches SWA(1;1), SWA(1;2), SWA(2;1) and SWA(2;2) and makes the analog signal hold the voltage level output in the first phase $T_1$ (the reference voltage $V_1$). In the third phase $T_3$, however, the control signals $C_2$ and $C_1$ take a high-level (logic-1), which turns on the switches SWA(1;1), SWA(1;2), SWA(2;1) and SWA(2;2) and the analog signal is charged to the reference voltage $V_3$. In the final fourth phase $T_4$, the control signal $C_2$ turns on the switches SWA(2;1) and SWA(2;2), the control signal $C_1$ turns off the switches SWA(1;1) and SWA(1;2) and the analog signal holds the level output in the third phase $T_3$ (the reference voltage $V_3$).

Figure 14:
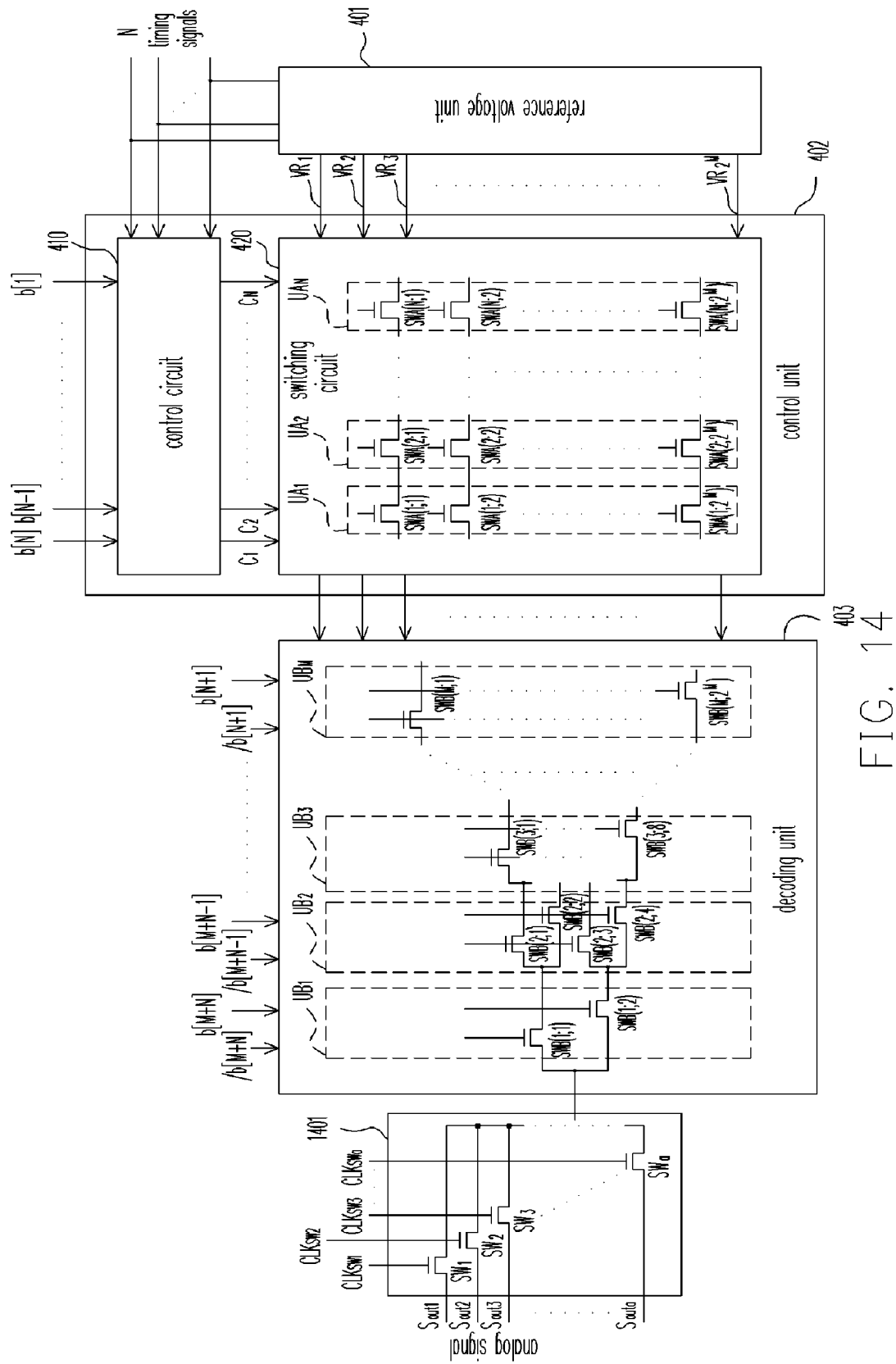
FIG. 14 is a detailed framework drawing of another DAC according to an embodiment of the present invention.

The output terminal of the embodiment in FIG. 4 can be modified by adding an output switching unit 1401 as shown in FIG. 14, which combines the spirit of the present invention with the prior art for more effectively utilizing the circuit. Wherein, the output switching unit 1401 is formed by aa switches $SW_1 \sim SW_{aa}$, the first terminal of the switch SW1 is coupled with the signal output terminal $S_{out1}$, the second terminal thereof is coupled with the output terminal of the decoding unit 403, the first terminal of the switch SW2 is coupled with the signal output terminal $S_{out2}$ and the second terminal thereof is coupled with the output terminal of the decoding unit 403. Analogically, the first terminal of the $b^{th}$ switch among the switches $SW_1 \sim SW_{aa}$ is coupled with the $b^{th}$ signal output terminal $S_{outb}$ and the second terminal of the $b^{th}$ switch is coupled with the output terminal of the decoding unit 403, where a and b are integers, and $1 \leq b \leq aa$. In this way, by using the switching unit 1401, aa signal output terminals $S_{out1} \sim S_{outaa}$ are formed in the DAC.

Furthermore, by using aa timing switching signals $CLK_{SW1} \sim CLK_{SWaa}$ to control the switches $SW_1 \sim SW_{aa}$, the analog signal is sent to one of the signal output terminals $S_{out1} \sim S_{outaa}$.

Figure 15:
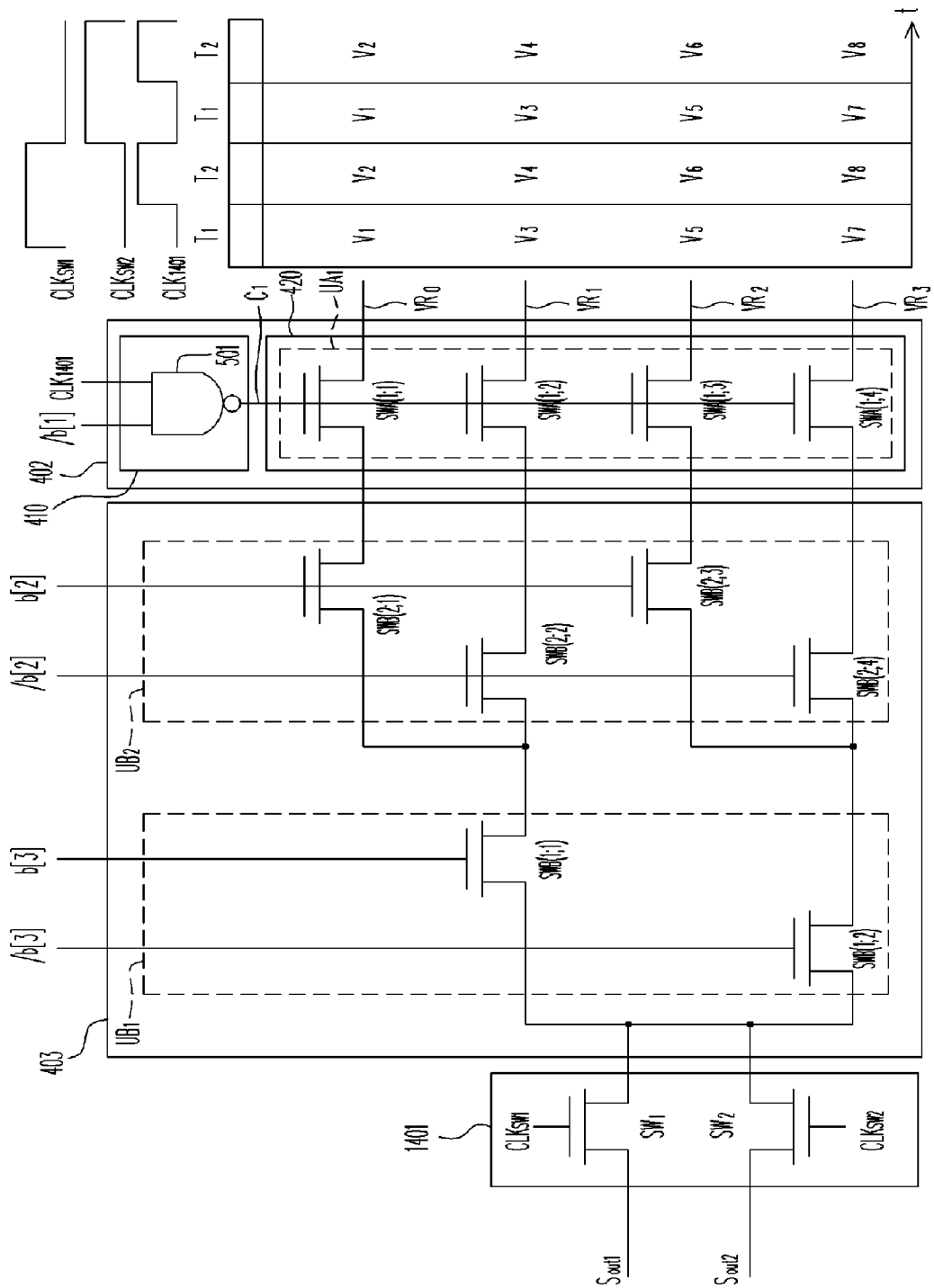
FIG. 15 is a detailed circuit drawing of a 3-bit DAC according to the embodiment shown in FIG. 14.

FIG. 15 is a 3-bits DAC according to the embodiment shown by FIG. 14. The control unit 402 in the embodiment receives a bit b[1] of the digital signal and the decoding unit 403 receives two bits b[2] and b[3] and two bits /b[2] and /b[3] of the digital signal, which is similar to the embodiment of FIG. 5. Thus, the wiring and the working principles of the control unit 402 and the decoding unit 403 are omitted to describe herein. The output switching unit 1401 in FIG. 15 is formed by switches SW1 and SW2. The first terminals of the switches SW1 and SW2 are electrically connected to the signal output terminals $S_{out1}$ and $S_{out2}$, respectively, while the second terminals of the switches SW1 and SW2 are electrically connected to the output terminal of the decoding unit 403.

Figure 16:
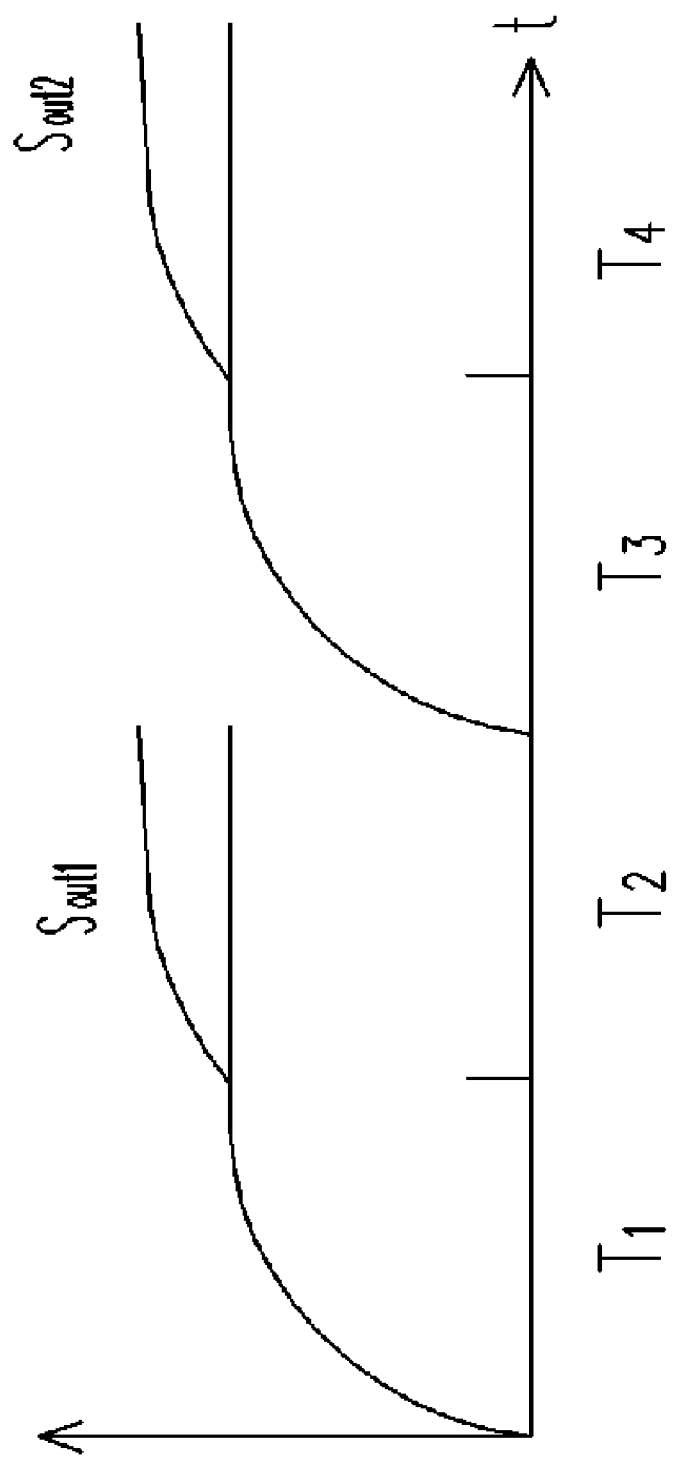
FIG. 16 is an analog signal timing diagram of the DAC of FIG. 15.

The working principle of the embodiment in FIG. 15 can be better explained by referring to FIG. 16. In fact, the control unit 402 and the decoding unit 403 in FIG. 15 are similar to the control unit 402 and the decoding unit 403 in FIG. 5. Therefore, the decoding unit 403 in FIG. 15 is able to output an analog signal similar to the one in FIG. 6A. Since the output switching unit 1401 uses the timing switching signals $CLK_{SW1}$ and $CLK_{SW2}$ to control the switches $SW_1$ and $SW_2$, the decoding unit 403 would output an analog signal similar to the one in FIG. 6A to the signal output terminals $S_{OUT1}$ in response to the switch $SW_1$ in on state in the first phase $T_1$ and the second phase $T_2$ (the switch $SW_2$ is off at the point); the decoding unit 403 would output an analog signal similar to the one in FIG. 6A to the signal output terminals $S_{out2}$ in response to the switch $SW_2$ in on state in the third phase $T_3$ and the fourth phase $T_4$ (the switch $SW_1$ is off at the point). FIG. 16 illustrates a timing diagram of the above-described analog signal from the first phase $T_1$ to the fourth phase $T_4$.

On the other hand, the present invention further provides a digital-to-analog conversion method. First, the method is to set the levels of the $2^{M+N}$ reference voltages $V_q$ in response to receiving a digital signal with (M+N)-bits. Wherein, N and M are integers larger than zero, $V_q$ represents a $q^{th}$ reference voltage and $1 \leq q \leq 2^{M+N}$. Next, in response to the levels of the above-mentioned reference voltages $V_q$, $2^M$ voltages $VR_k$ are provided in an output period, and the levels of the voltages $VR_k$ in $2^N$ phases of the output period are the levels of the reference voltages $V_{((k-1) \cdot 2^N)+1} \sim V_{k \cdot 2^N}$, respectively. Afterwards, one of the above-described $2^M$ voltages $VR_k$ is selected and further a level among the levels $V_{((k-1) \cdot 2^N)+1} \sim V_{k \cdot 2^N}$ of the selected voltage $VR_k$ is selected as the analog signal. In this way, the received digital signal with (M+N)-bits is converted into an analog signal. The detail of the method is covered by the above-described embodiments and omitted to describe herein.

In summary, the present invention employs a control unit and uses the control of the N bits of the digital signal and the N timing signals to make multiple reference voltages share a same output terminal, which effectively downsizes the chip area required mainly by the reference voltage lines and the decoding unit. In comparison with the prior art, for the application of the present invention in a source driver, it not only reduces the chip area, but also has the advantage of outputting the analog signal phase by phase without disposing an extra switch, which enables the driving driver to drive every output terminal with sufficient charge time at any time.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A digital-to-analog converter (DAC), used for selecting one of at most $2^{M+N}$ reference voltages $V_q$ as the analog signal for output according to a (M+N)-bit digital signal, wherein $V_q$ represents a $q^{th}$ reference voltage, $1 \leq q \leq 2^{M+N}$, and N and M are integers larger than zero; the DAC comprising:
- a reference voltage unit, comprising $2^M$ output terminals $VR_k$, wherein $VR_k$ represents the $k^{th}$ output terminal, $1 \leq k \leq 2^M$;
- a control unit, coupled with the $2^M$ output terminals $VR_k$ of the reference voltage unit, used for respectively delivering at least a reference voltage among the reference voltages outputted from every said output terminal $VR_k$ to the $2^M$ output terminals of the control unit according to the N bits among the bits of the digital signal; and
- a decoding unit, coupled with the $2^M$ output terminals of the control unit, used for selecting one of the signals from the $2^M$ output terminals of the control unit as the analog signal according to the M bits among the bits of the digital signal,
- wherein each of the output terminals $VR_k$ respectively outputs reference voltages $V_{(k-1) \cdot 2^{-N}+1} \sim V_{k \cdot 2^{-N}}$ in $2^N$ phases of an output period.

2. The DAC as recited in claim 1, wherein the reference voltages $V_1 \leq V_2 \leq \ldots \leq V_{2^{(M+N)}}$.

3. The DAC as recited in claim 1, wherein the reference voltages $V_1 \geq V_2 \geq \ldots V_{2^{(M+N)}}$.

4. The DAC as recited in claim 1, wherein if b[x] represents the $x^{th}$ bit of the digital signal, $1 \leq x \leq (M+N)$, b[1] is the LSB of the digital signal and b[M+N] is the MSB of the digital signal, the control unit receives b[1]~b[N] of the digital signal, while the decoding unit receives b[N+1]~b[M+N] of the digital signal.

5. The DAC as recited in claim 4, wherein the control unit comprises:
- a control circuit, used for outputting N control signals $C_t$ according to N timing signals and the bits b[1]~b[N], where $1 \leq t \leq N$; and
- a switching circuit, comprising N switching units, wherein each of the switching units comprises $2^M$ switches SWA(s;k), wherein SWA(s;k) represents the $k^{th}$ switch in the $s^{th}$ switching unit, the second terminal of the switch SWA(s;k) is coupled with the first terminal of the SWA(s+1;k), the second terminal of the switch SWA(N;k) is coupled with the output terminal $VR_k$ of the reference voltage unit and the control terminal of the switch SWA(t;k) receives the control signal $C_t$, where $1 \leq s \leq N$.

6. The DAC as recited in claim 5, wherein the bit /b[i] and the bit b[i] have logic-value inverted to each other, the decoding unit comprises M switch units, the $i^{th}$ switch unit comprises $2^i$ switches SWB(i;r) where SWB(i;r) represents the $r^{th}$ switch in the $i^{th}$ switch unit; the second terminal of the switch SWB(j;r) is coupled with the first terminals of the switches SWB(j+1;2r−1) and SWB(j+1;2r), the second terminal of the switch SWB(M;r) is coupled with the switching circuit, the control terminal of the switch SWB(i;2g−1) receives the bit b[M+N+1−i], the control terminal of the switch SWB(i;2g) receives the bit /b[M+N+1−i], where $1 \leq i \leq M$, $1 \leq j \leq (M-1)$, the range of the r value in the $i^{th}$ switch unit is $1 \leq r \leq 2^i$ and the range of the g value in the $i^{th}$ switch unit is $1 \leq g \leq 2^{i-j}$.

7. The DAC as recited in claim 5, wherein when N=1, the control circuit outputs the control signal according to the timing signal and the bit b[1] and the control circuit comprises:
- a NAND-gate, wherein the first terminal thereof receives the phase-inverted signal of the bit b[1], the second terminal thereof receives the timing signal and the NAND-gate outputs the control signal.

8. The DAC as recited in claim 5, wherein when N=1, the control circuit outputs the control signal according to the timing signal and the bit b[1] and the control circuit comprises:
- an OR-gate, wherein the first terminal and the second terminal thereof respectively receive the bit b[1] and the timing signal and the OR-gate outputs the control signal.

9. The DAC as recited in claim 5, wherein when N=2, the control circuit outputs the first control signal and the second control signal according to the first timing signal, the second timing signal and the bits b[1]~b[2] and the control circuit comprises:
- a first NAND-gate, wherein the first terminal thereof receives the phase-inverted signal of the first timing signal, while the second terminal thereof receives the phase-inverted signal of the second timing signal;
- a first XOR-gate, wherein the first terminal thereof receives the phase-inverted signal of the second timing signal, while the second terminal thereof receives the phase-inverted signal of the bit b[2];
- a second XOR-gate, wherein the first terminal thereof receives the phase-inverted signal of the first timing signal, while the second terminal thereof receives the phase-inverted signal of the bit b[1];
- a second NAND-gate, wherein the first terminal thereof is electrically connected to the output terminal of the first NAND-gate, the second terminal thereof is electrically connected to the output terminal of the first XOR-gate and the second NAND-gate is used for outputting the second control signal; and
- a third NAND-gate, wherein the first terminal thereof is electrically connected to the output terminal of the first NAND-gate, the second terminal thereof is electrically connected to the output terminal of the second XOR-gate and the third NAND-gate is used for outputting the first control signal.

10. The DAC as recited in claim 1, for delivering the analog signal to one of aa signal output terminals according to aa timing switching signals where aa is an integer larger than zero; the DAC further comprising:
- an output switching unit, comprising aa switches, wherein the first terminal of the $b^{th}$ switch is coupled with the output terminal of the $b^{th}$ signal, the second terminal of the $b^{th}$ switch is coupled with the output terminal of the decoding unit and the on/off states between the first terminal and the second terminal of the $b^{th}$ switch are determined by the $b^{th}$ timing switching signal, where b is an integer and $1 \leq b \leq aa$.

11. A digital-to-analog converting method, used for converting a digital signal into an analog signal; the converting method comprising:
- receiving a digital signal with (M+N) bits, wherein N and M are integers larger than zero;

setting the levels of $2^{M+N}$ reference voltages $V_q$, wherein $V_q$ represents the $q^{th}$ reference voltage and $1 \leq q \leq 2^{M+N}$;

providing $2^M$ voltages $VR_k$ in an output period, wherein the levels of the voltage $VR_k$ in $2^N$ phases of the output period are $V_{((k-1)\cdot 2^N)+1} \sim V_{k \cdot 2^N}$, respectively;

selecting one of the $2^M$ voltages $VR_k$; and selecting at least a level among the levels $V_{((k-1)\cdot 2^N)+1} \sim V_{k \cdot 2^N}$ of the selected voltage $VR_k$ as the analog signal.

12. The digital-to-analog converting method as recited in claim 11, wherein the reference voltages $V_1 \leq V_2 \leq \ldots \leq V_{2^{(M+N)}}$.

13. The digital-to-analog converting method as recited in claim 11, wherein the reference voltages $V_1 \geq V_2 \geq \ldots \geq V_{2^{(M+N)}}$.

14. The digital-to-analog converting method as recited in claim 11, wherein the $x^{th}$ bit of the digital signal is b[x], b[1]~b[N] are a set of less significant bits, b[N+1]~b[M+N] are a set of larger bits, b[1] is the least significant bit (LSB) and b[M+N] is the most significant bit (MSB), wherein x is an integer and $1 \leq x \leq (M+N)$.

* * * * *